US007175327B1

(12) United States Patent
Tsai

(10) Patent No.: US 7,175,327 B1
(45) Date of Patent: Feb. 13, 2007

(54) TRANSMITTING MODULE STRUCTURE WITH RIGID LIGHT PIPES

(75) Inventor: Nelson Tsai, Sijhih (TW)

(73) Assignee: Superworld Electronics Co., Ltd., Tao Yuan Shien (TW)

( * ) Notice: Subject to any disclaimer, the term of this patent is extended or adjusted under 35 U.S.C. 154(b) by 0 days.

(21) Appl. No.: 11/284,812

(22) Filed: Nov. 23, 2005

(51) Int. Cl.
*H01L 33/00* (2006.01)

(52) U.S. Cl. ........................ 362/555; 362/26; 362/311; 439/490

(58) Field of Classification Search ................ 362/555, 362/26, 311; 439/490
See application file for complete search history.

(56) References Cited

U.S. PATENT DOCUMENTS 5,876,239 A * 3/1999 Morin et al. ................ 439/490

* cited by examiner

*Primary Examiner*—Stephen F Husar
*Assistant Examiner*—Meghan K. Dunwiddie
(74) *Attorney, Agent, or Firm*—Troxell Law Office PLLC

(57) ABSTRACT

A communication transmitting module with a rigid light pipe, the communication transmitting module has thereon a protrusion with a pair of recesses near its bottom, and has on its bottom side an engaging block with a bevel surface. The rigid light pipe in the shape of "L" includes an upper and a lower portion, the upper portion is formed thereon an engaging hole for extending therethrough of the protrusion of the communication transmitting module, the engaging hole is formed near it a raised portion engageable in the recesses of the communication transmitting module; and the bottom of the lower portion provided with LEDs has a hook extendible from the bevel surface on the bottom side of the communication transmitting module to engage in the engaging block. The present invention can be easily and firmly assembled.

5 Claims, 5 Drawing Sheets

TRANSMITTING MODULE STRUCTURE WITH RIGID LIGHT PIPES

BACKGROUND OF THE INVENTION

1. Field of the Invention

The present invention is related to a communication transmitting module provided in a network connector, and especially to a structure that can easily and firmly assemble a rigid light pipe with the communication transmitting module.

2. Description of the Prior Art

The structure of an RJ-45 often used presently has one or a plurality of communication transmitting modules installed in a shielding housing. Each communication transmitting module is provided with an insulation base with communication pins arranged on its front surface, and with a wave filtering coil therein for getting functions of wave filtering and separating abnormal voltage. When in assembling, the communication pins of the communication transmitting module are inserted into a socket seat provided in the shielding housing of a connector; the front surface of the socket seat can be inserted therein with a plug of a communication network line for data transmitting.

In order to show the working state of the connector, the connector generally is provided on its front surface with a plurality of indicating lamps, normally LEDs, lightening and extinguishing of the indicating lamps can show the state of working. However, by virtue that connecting pins of the LED indicating lamps were inconvenient for being arranged in the connector, rigid light pipes was developed for the convenience of designing the interior structure of the entire connector.

By the fact that a conventional rigid light pipe is of a structure bent for 90 degree to be in the shape of "L", it is assembled on the top and the rear side of a communication transmitting module. However because of its structural designing problem, assembling of the rigid light pipes becomes very cumbersome, and sometimes glue is required to help fixing, and improvement is needed.

SUMMARY OF THE INVENTION

A communication transmitting module with a rigid light pipe of the present invention has thereon a protrusion with a pair of recesses near its bottom, and has on its bottom side an engaging block with a bevel surface. The rigid light pipe in the shape of "L" includes an upper and a lower portion, the upper portion is formed thereon an engaging hole for extending therethrough of the protrusion of the communication transmitting module, the engaging hole is formed near it a raised portion engageable in the recesses of the communication transmitting module; and the bottom of the lower portion provided with LEDs has a hook extendible from the bevel surface on the bottom side of the communication transmitting module to engage in the engaging block.

In assembling the present invention, the engaging hole on the rigid light pipe is inserted therein with the protrusion on the communication transmitting module, then the hook of the rigid light pipe is inserted by sliding into and along a bevel surface on the rear bottom side of the communication transmitting module, thus the hook is engaged in the engaging block, meantime, the recesses near the protrusion of the communication transmitting module exactly are engaged with the raised portion near the engaging hole of the rigid light pipe. With this structure, the rigid light pipe is very easily assembled on the top and the rear side of the communication transmitting module. Such an assembling structural is very firm and not subjected to separating.

The present invention will be apparent in its structural features and effect of assembling after reading the detailed description of the preferred embodiment thereof in reference to the accompanying drawings.

DETAILED DESCRIPTION OF THE PREFERRED EMBODIMENT

Figure 1:
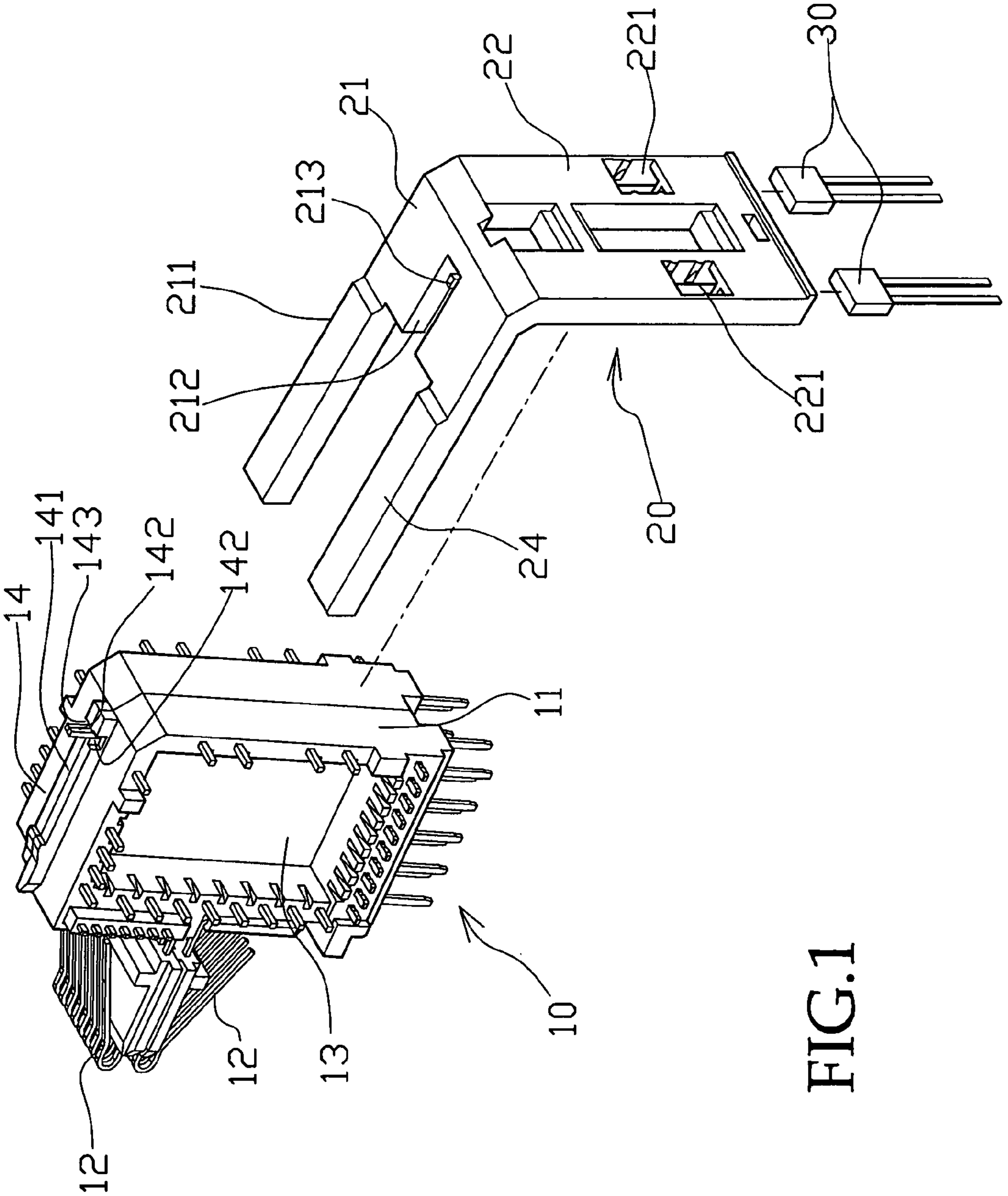
FIG. 1 is an anatomic perspective view of the present invention.
Figure 2:
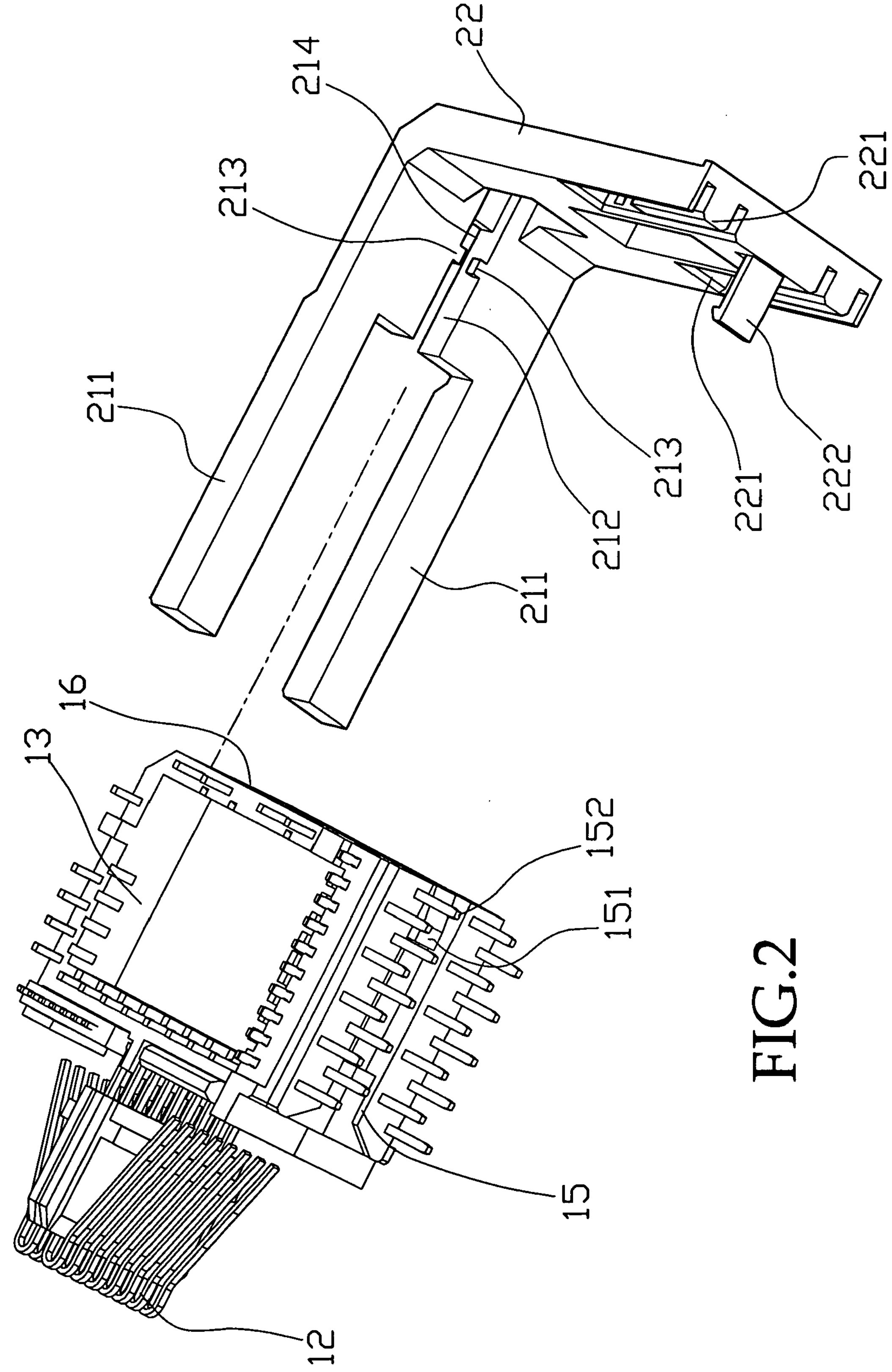
FIG. 2 is an anatomic perspective view from another viewing angle of the present invention.
Figure 3:
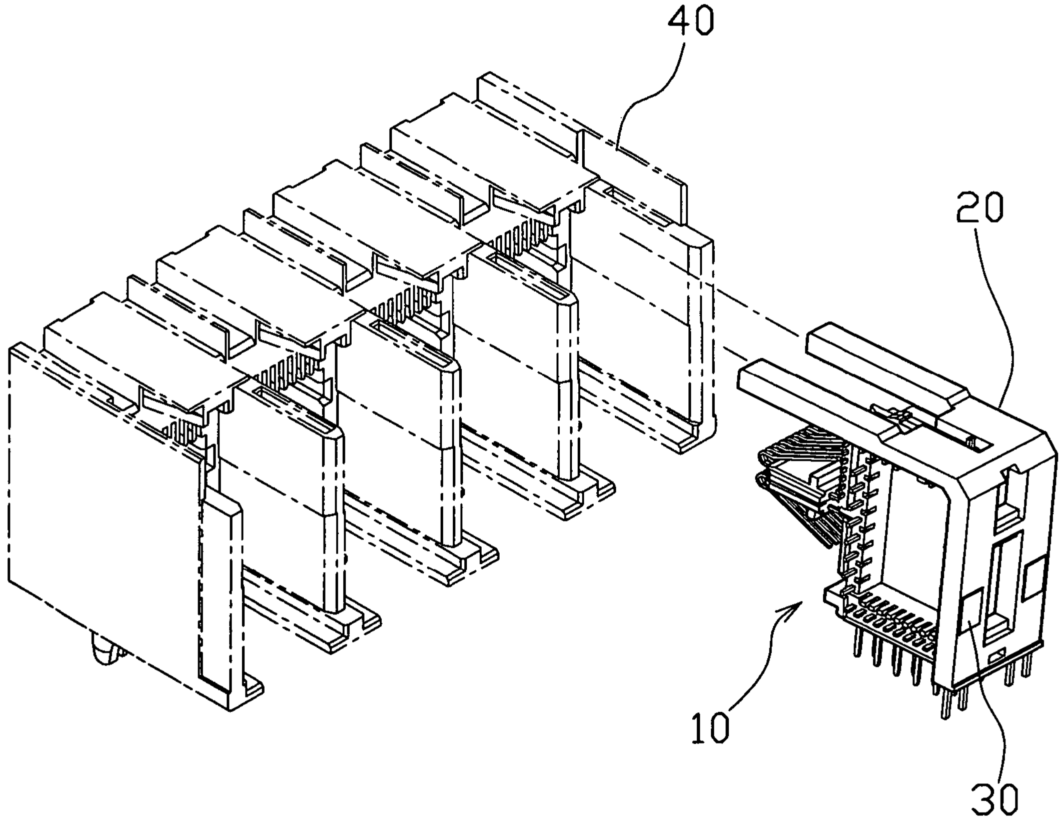
FIG. 3 is a perspective view showing assembling of present invention.

Referring to FIGS. 1–3, the present invention mainly comprises a communication transmitting module 10 and a rigid light pipe 20.

The communication transmitting module 10 has an insulating base 11, and is provided with communication pins 12 arranged on its front surface; the insulating base 11 has on each of its lateral sides a recess 13 having a wave filtering coil therein for getting functions of wave filtering and separating abnormal voltage; the recesses 13 on the two lateral sides of the insulating base 11 are covered with a circuit board.

Referring to FIG. 1, the communication transmitting module 10 has on its upper surface 14 a protruding strip 141 extending in the full length of the upper surface 14 forming a protrusion 143 thereon, the protruding strip 141 is formed in front of and near the protrusion 143 a pair of recesses 142.

And referring to FIG. 1, the communication transmitting module 10 has at the rear portion on its bottom side 15 an engaging block 151; a bevel surface 152 is formed between the engaging block 151 and the rear side of the communication transmitting module 10.

The rigid light pipe 20 in the shape of "L" includes an upper portion 21 and a lower portion 22.

The front end of the upper portion 21 is forked to form two beams 211, a cut recess 212 with a width about that of the protruding strip 141 is formed near a bending area of the upper portion 21, a pair of raised portions 213 are provided in the cut recess 212, the raised portions 213 form an engaging hole 214 with a rear section of the cut recess 212. The engaging hole 214 of the upper portion 21 allows extending therethrough of the protrusion 143 of the communication transmitting module 10; while the raised portions 213 of the engaging hole 214 can be engaged in the recesses 142 of the communication transmitting module 10.

The lower portion 22 has two LED grooves 221 for mounting therein LED indicating lamps 30, in order that the light from the LED indicating lamps 30 is transmitted to the beams 211 on the front end of the upper portion 21 to show lightening and extinguishing of the indicating lamps. The bottom of the lower portion 22 has a hook 222 extendible along the bevel surface 152 on the bottom side 15 of the communication transmitting module 10 to engage in the engaging block 151.

Figure 4:
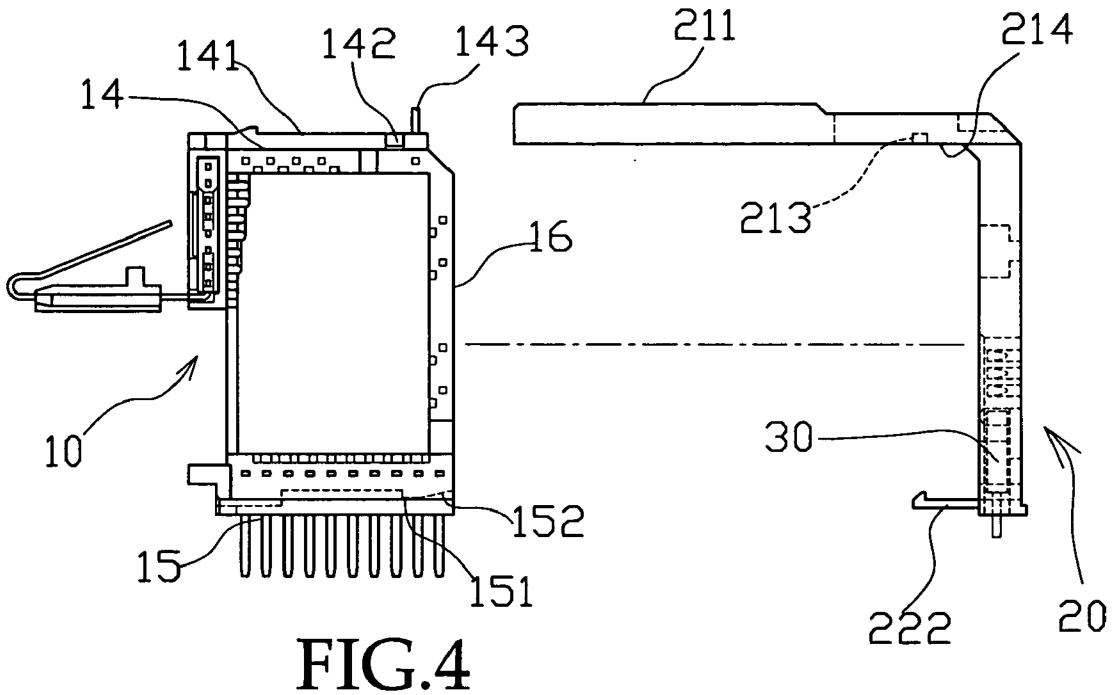
FIG. 4 is a schematic plane view showing the state before assembling of the present invention.
Figure 5:
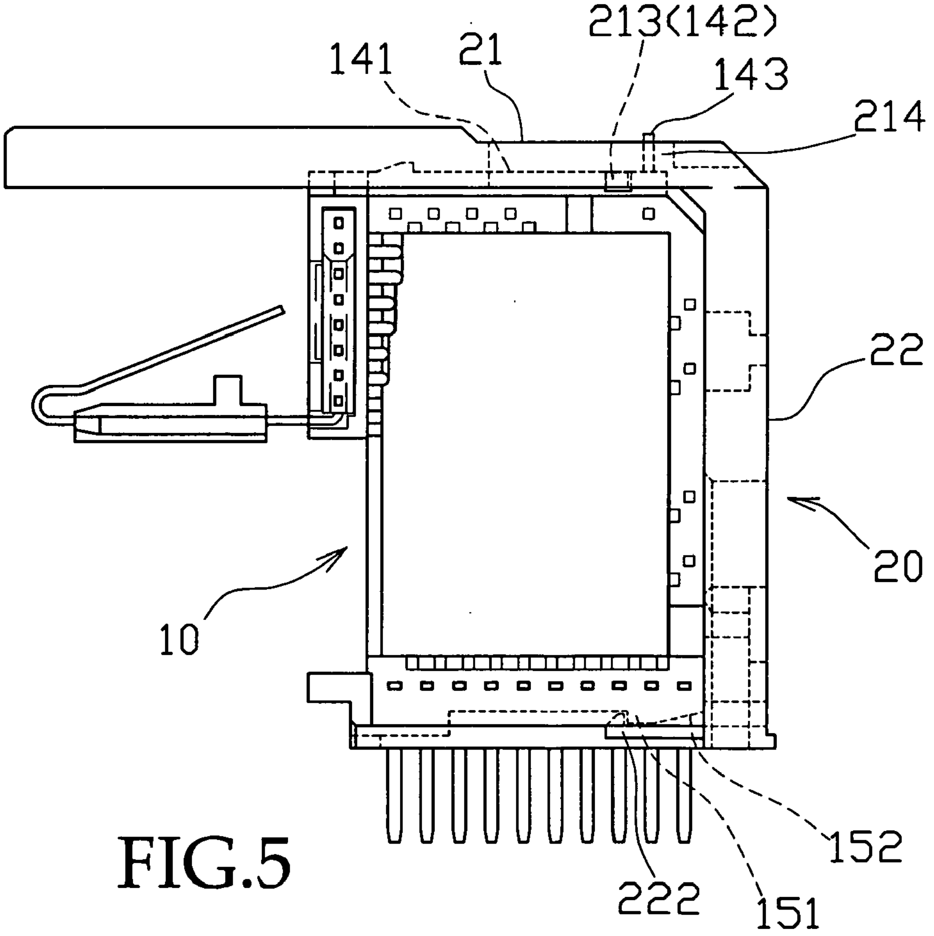
FIG. 5 is a schematic plane view showing the state after assembling of the present invention.

Moreover, as shown in FIGS. 4 and 5 showing the operation of assembling of the rigid light pipe 20 in the communication transmitting module 10 of the present invention, in FIG. 4, the LED grooves 221 of the lower portion 22 of the rigid light pipe 20 firstly are assembled with the LED indicating lamps 30. Then the hook 222 on the lower portion 22 of the rigid light pipe 20 is inserted by sliding into and along the bevel surface 152 at the rear portion on its bottom side 15 of the communication transmitting module 10, thus the hook 222 is engaged in the engaging block 151, and then the lower portion 22 approaches from a rear side 16 of the of the communication transmitting module 10 to render the protrusion 143 to pass through a gap between the two raised portions 213 on the raised portions 213 of the rigid light pipe 20 into the engaging hole 214; meantime, the recesses 142 near the protrusion 143 of the communication transmitting module 10 exactly are engaged with the raised portion 213 near the engaging hole 214 of the rigid light pipe 20, such as is shown in FIG. 5, and assembling can be completed.

Apparently, operation of the present invention in assembling is very easy and fast, and after assembling, and by the fact that after assembling, the protrusion 143 is extended into the engaging hole 214, the raised portions 213 are engaged in the recesses 142, and the hook 222 is engaged in the engaging block 151, the entire structure after assembling is very firm and not subjected to separating.

Figure 6:
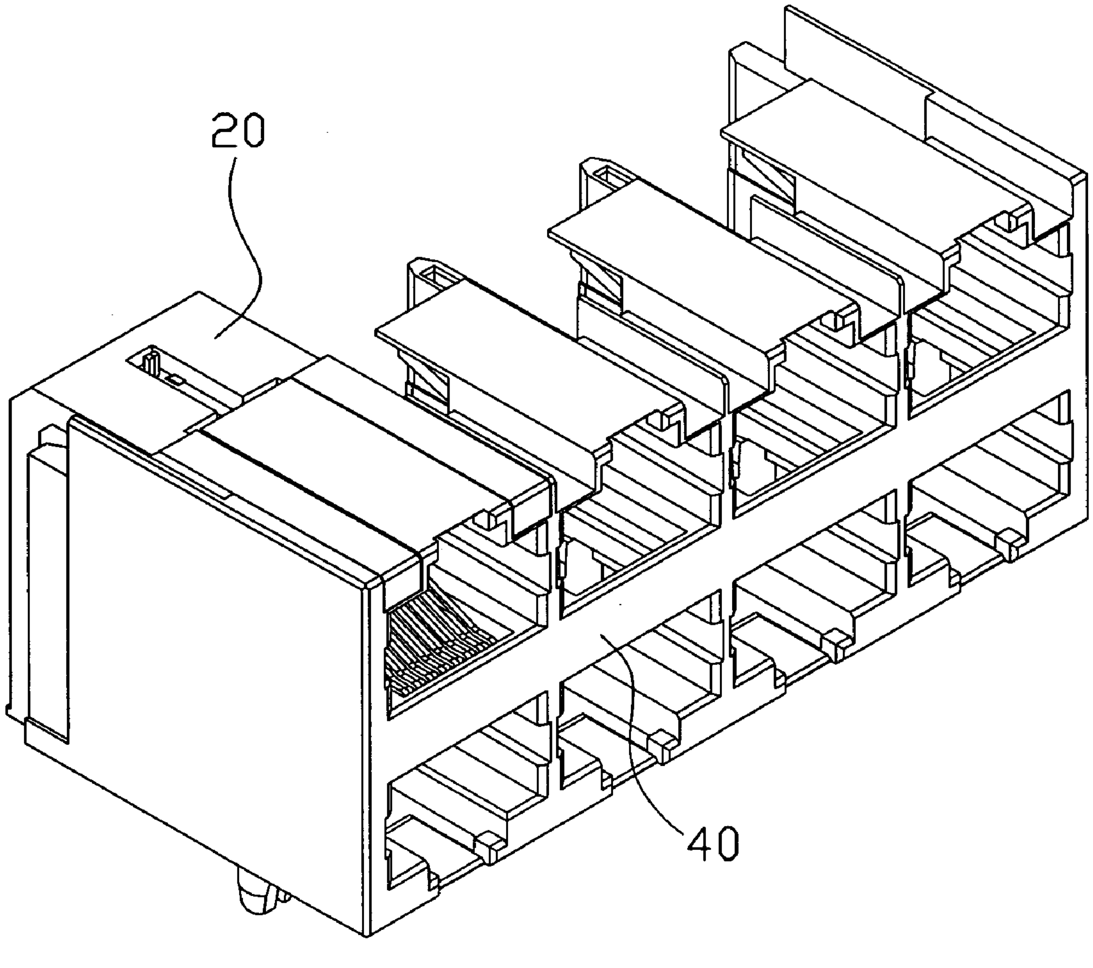
FIG. 6 is a perspective view showing that the present invention further is assembled in a socket seat of a connector.

After assembling of the communication transmitting module 10 with the rigid light pipe 20 of the present invention, as shown in FIG. 3, they can be mounted in a socket seat 40, and also please refer to FIG. 6. Then a shielding housing is used to cover the socket seat 40 and the communication transmitting module 10, and assembling of an entire connector is completed. And then a plug of a communication network line can be inserted from the front side of the socket seat 40. In FIG. 6, it is shown that the front side of the beams 211 on the upper portion 21 of the rigid light pipe 20 is at the front side of the connector, thus the light from the LED indicating lamps 30 is transmitted to the end surfaces of the beams 211.

Although the embodiment shown in the drawings is a stacked connector, it can also be applied to a single separated connector. Therefore, the present invention provides mainly an innovative assembled structure composed of a rigid light pipe and a communication transmitting module; its operation of assembling is very easy and fast. Having now particularly described and ascertained the novelty and improvement of my invention and in what manner the same is to be performed, what we claim will be declared in the claims followed.

The invention claimed is:

1. A communication transmitting module assembly located in a socket seat and connected to a plug of a communication net work line, the communication transmitting module comprising:

a) a transmitting module having:

I) an insulating base;

ii) a plurality of communication pins protruding outwardly from a front of the insulating base;

iii) a protrusion extending upwardly from an upper surface of the insulating base;

iv) two recesses, one of the two recesses is located on each of two sides of the protrusion; and v) an engaging block located on a bottom of the insulating base and having a bevel surface;

b) a rigid light pipe selectively connected to the transmitting module and having:

I) an upper portion having two raised portions and an engaging hole defined by the two raised portions, the protrusion is inserted into the engaging hole, one of the two raised portions is located in the each of the two recesses; and ii) a lower portion having a hook movable along the bevel surface and engaging the engaging block; and c) a plurality of LED indicating lamps located in the lower portion of the rigid light pipe.

2. The communication transmitting module assembly according to claim 1, wherein the transmitting module has a protruding strip located on the upper surface of the insulating base and extending along a length thereof, the protrusion extending from the protruding strip, and the two recesses are formed in opposing sides of the protruding strip.

3. The communication transmitting module assembly according to claim 1, wherein the bevel surface is located between the engaging block and a rear of the insulating base.

4. The communication transmitting module assembly according to claim 1, wherein the upper portion of the rigid light pipe has two beams and a cut recess formed between the two beams, the two raised portions are located in the cut recess.

5. The communication transmitting module assembly according to claim 1, wherein the lower portion of the rigid light pipe has a plurality of LED grooves, one of the plurality of LED indicating lamps is inserted into each of the plurality of LED grooves.

* * * * *